United States Patent
Long et al.

[19]

[11] Patent Number: 6,091,256
[45] Date of Patent: *Jul. 18, 2000

[54] CONTACT DEVICE FOR MAKING CONNECTION TO AN ELECTRONIC CIRCUIT DEVICE

[75] Inventors: Tom Long, Portland; Mohamed Sabri, Beaverton; J. Lynn Saunders, Hillsboro, all of Oreg.

[73] Assignee: Microconnect, Inc., North Plains, Oreg.

[*] Notice: This patent is subject to a terminal disclaimer.

[21] Appl. No.: 08/812,986

[22] Filed: Mar. 4, 1997

Related U.S. Application Data

[63] Continuation of application No. 08/446,020, May 19, 1995, Pat. No. 5,621,333.

[51] Int. Cl.[7] .................................................. G01R 1/073
[52] U.S. Cl. ............................................ 324/762; 324/757
[58] Field of Search .................................. 324/762, 72.5, 324/754, 757, 767

[56] References Cited

U.S. PATENT DOCUMENTS

| | | | |
|---|---|---|---|
| 3,405,361 | 10/1968 | Kattner et al. | 324/158 |
| 3,810,016 | 5/1974 | Chayka et al. | 324/158 P |
| 3,832,632 | 8/1974 | Ardezzone | 324/158 P |
| 3,851,249 | 11/1974 | Roch | 324/754 |
| 3,866,119 | 2/1975 | Ardezzone et al. | 324/158 P |
| 4,035,723 | 7/1977 | Kvaternik | 324/754 |
| 4,161,692 | 7/1979 | Tarzwell | 324/158 P |
| 4,574,235 | 3/1986 | Kelly et al. | 324/158 F |
| 4,585,727 | 4/1986 | Reams | 430/312 |
| 4,588,241 | 5/1986 | Ardezzone | 339/59 M |
| 4,636,722 | 1/1987 | Ardezzone | 324/158 P |
| 4,673,839 | 6/1987 | Veenendaal | 310/338 |
| 4,697,143 | 9/1987 | Lockwood et al. | 324/158 P |
| 4,749,942 | 6/1988 | Sang et al. | 324/158 P |
| 4,751,457 | 6/1988 | Veenendaal | 324/158 F |
| 4,758,785 | 7/1988 | Rath | 324/158 P |
| 4,764,723 | 8/1988 | Strid | 324/158 P |
| 4,829,233 | 5/1989 | Flemming et al. | 324/58.5 |
| 4,829,242 | 5/1989 | Carey et al. | 324/158 P |
| 4,891,585 | 1/1990 | Janko et al. | 324/158 P |
| 4,894,612 | 1/1990 | Drake et al. | 324/158 |
| 4,899,099 | 2/1990 | Mendenhall et al. | 324/158 F |
| 4,904,933 | 2/1990 | Snyder et al. | 324/158 F |
| 4,906,920 | 3/1990 | Huff et al. | 324/158 P |
| 4,912,399 | 3/1990 | Greub et al. | 324/158 P |
| 4,918,383 | 4/1990 | Huff et al. | 324/158 P |
| 4,943,768 | 7/1990 | Niki et al. | 324/158 F |
| 4,975,638 | 12/1990 | Evans et al. | 324/158 P |
| 4,980,637 | 12/1990 | Huff et al. | 324/158 P |
| 5,061,894 | 10/1991 | Ikeda | 324/158 F |
| 5,191,708 | 3/1993 | Kasukabe et al. | 29/846 |
| 5,221,895 | 6/1993 | Janko et al. | 324/762 |
| 5,355,080 | 10/1994 | Sato et al. | 324/761 |
| 5,414,371 | 5/1995 | Isaac | 324/762 |
| 5,416,429 | 5/1995 | McQuade et al. | 324/762 |
| 5,489,855 | 2/1996 | Poisel | 324/762 |

FOREIGN PATENT DOCUMENTS

| | | |
|---|---|---|
| 0220830 | 5/1987 | European Pat. Off. . |
| 0230348 | 7/1987 | European Pat. Off. . |
| 0276900 | 8/1988 | European Pat. Off. . |
| 0283219 | 9/1988 | European Pat. Off. . |
| 0331282 | 9/1989 | European Pat. Off. . |
| 0360396 | 3/1990 | European Pat. Off. . |
| 0361779 | 4/1990 | European Pat. Off. . |
| 0369554 | 5/1990 | European Pat. Off. . |
| 3165033 | 12/1992 | Japan . |

*Primary Examiner*—Ernest Karlsen
*Attorney, Agent, or Firm*—Alan R. Loudermilk

[57] ABSTRACT

A contact device having a plurality of nominally coplanar first contact elements makes electrical contact with corresponding nominally coplanar second contact elements of an electronic device when the contact device and the electronic device are positioned so that the plane of the first contact elements is substantially parallel to the plane of the second contact elements and relative displacement of the devices is effected in a direction substantially perpendicular to the plane of the first contact elements and the plane of the second contact elements. The contact device comprises a stiff substrate having a major portion with fingers projecting therefrom in cantilever fashion, each finger having a proximal end at which it is connected to the major portion of the substrate and an opposite distal end and there being one or two contact elements on the distal end of each finger. It is necessary to effect relative displacement of the devices by a distance d from first touchdown to achieve last touchdown. The substrate is dimensioned such that relative displacement of the devices by a distance d from first touchdown generates a reaction force at each contact element of about $0.1*f \pm 0.1*f$, and further relative displacement by a distance of about 75 $\mu$m or $5*d$ beyond last touchdown generates a reaction force at each contact element of about $0.9 \pm 0.1*f$.

32 Claims, 8 Drawing Sheets

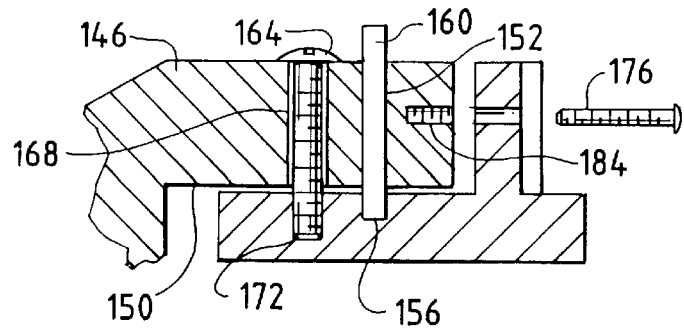
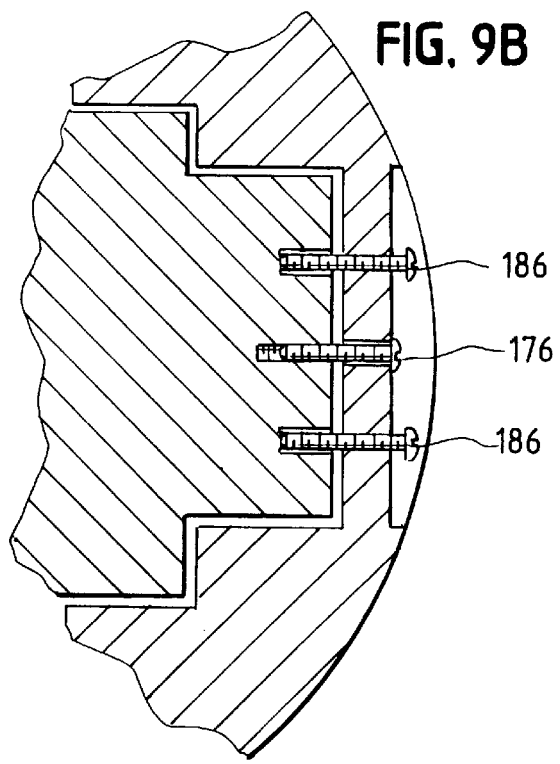
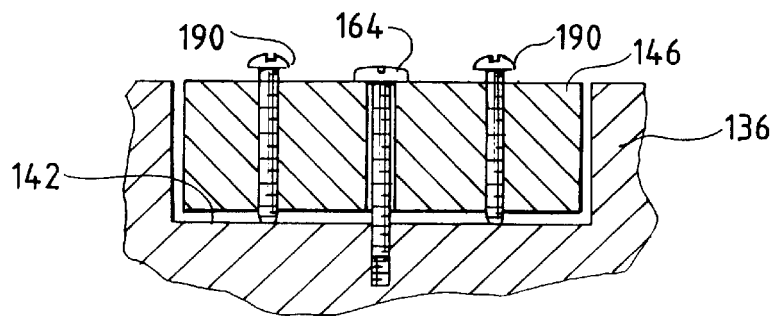

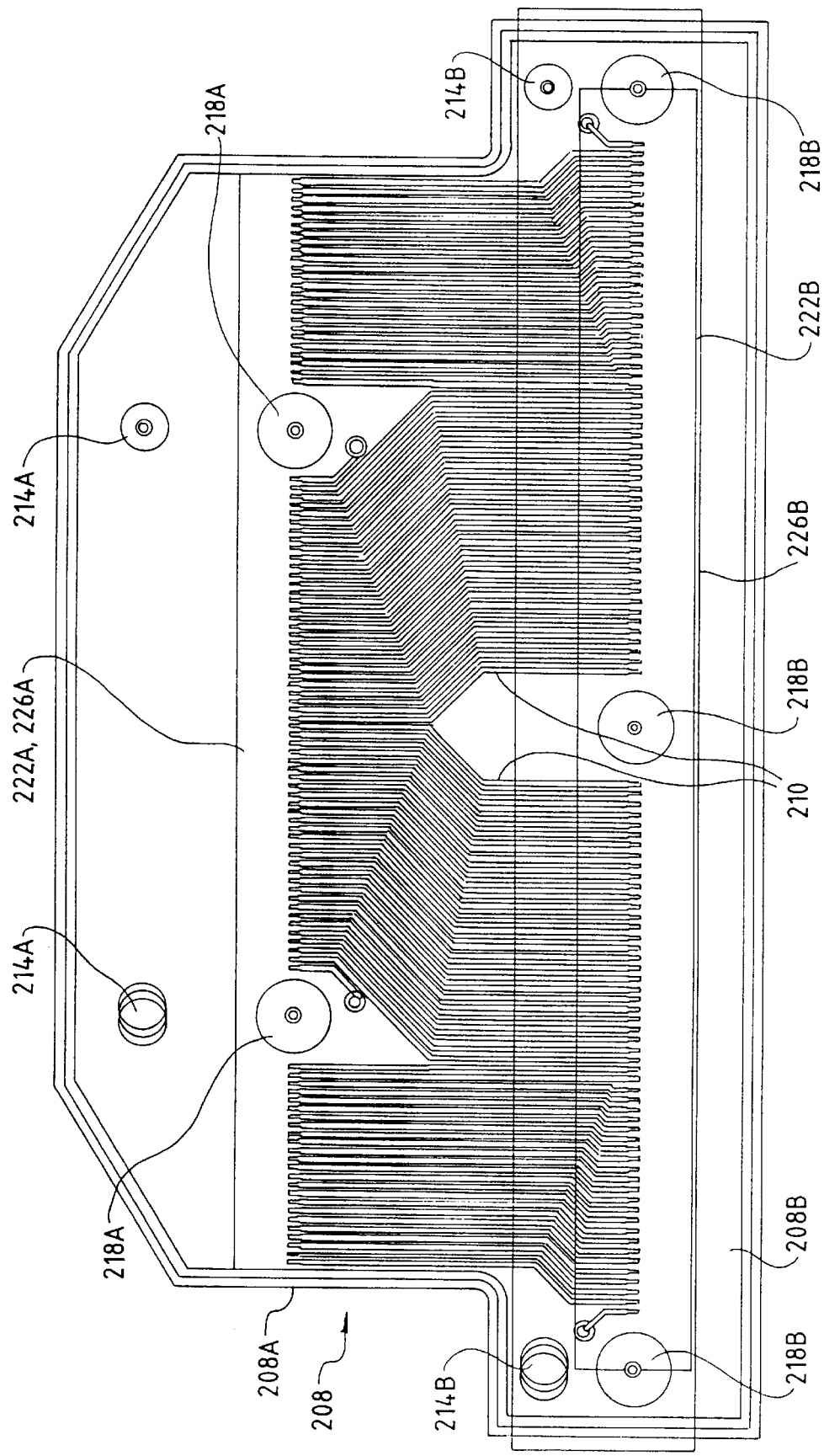

CONTACT DEVICE FOR MAKING CONNECTION TO AN ELECTRONIC CIRCUIT DEVICE

This is a continuation of application Ser. No. 08/446,020, filed May 19, 1995, now U.S. Pat. No. 5,621,333.

BACKGROUND OF THE INVENTION

This invention relates to a contact device for making connection to an electronic circuit device and to a method of fabricating such a contact device.

An important aspect of manufacture of integrated circuit chips is the testing of the circuit embodied in the chip in order to verify that it operates according to specifications. Although the circuit could be tested after the chip has been packaged, the expense involved in dicing the wafer and packaging the individual chips makes it preferable to test the circuit as early as possible in the fabrication process, so that unnecessary efforts will not be expended on faulty devices. It is therefore desirable that the circuits be tested either immediately after wafer fabrication is completed, and before separation into dice, or after dicing, but before packaging. In either case, it is necessary to make electrical connection to all the circuits' external connection points (usually bonding pads) in a non-destructive way, so as not to interfere with subsequent packaging and connection operations.

U.S. Pat. No. 5,221,895 discloses a probe for testing integrated circuits. The probe includes a stiff metal substrate made of beryllium copper alloy, for example. The substrate is generally triangular in form and has two edges that converge from a support area toward a generally rectangular tip area. There is a layer of polyimide over one main face of the substrate, and gold conductor runs are formed over the layer of polyimide. The conductor runs and the metal substrate form microstrip transmission lines. The conductor runs extend parallel to one another over the tip area and fan out toward the support area. A contact bump is deposited on the end of each conductor run that is on the tip area. The tip area of the substrate is slit between each two adjacent conductor runs whereby the tip area is divided into multiple separately flexible fingers that project in cantilever fashion from the major portion of the substrate.

The probe shown in U.S. Pat. No. 5,221,895, is designed to be used in a test station. Such a test station may include four probes having the configuration shown in U.S. Pat. No. 5,221,895, the probes being arranged in an approximately horizontal orientation with their contact bumps facing downwards, with the four rows of contact bumps along four edges of a rectangle. The DUT is generally rectangular and has connection pads along the edges of one face. The DUT is placed in a vacuum chuck with its connection pads upwards. The vacuum chuck drives the DUT upward into contact with the probe, and overdrives the DUT by a predetermined distance from first contact. According to current industry standards, such a test station is designed to produce a nominal contact force of 10 grams at each connection pad. Therefore, the amount of the overdrive is calculated to be such that if contact is made at all connection pads simultaneously, so that each contact bump is deflected by the same amount, the total contact force will be 10 grams force multiplied by the number of connection pads.

If the material of the probe substrate is a beryllium copper alloy and each flexible finger has a length of about 0.75 mm, a width of about 62 $\mu$m, and a height of about 250 $\mu$m, and the probe is supported so that the mechanical ground is at the root of the fingers, the contact force produced at the tip of the finger is about 7.7 grams for each micrometer of deflection of the tip of the finger. Therefore, if the contact bumps at the tips of the fingers are coplanar and the connection pads of the DUT are coplanar, and the plane of the contact bumps is parallel to the plane of the connection pads, an overdrive of about 1.3 $\mu$m from first contact will result in the desired contact force of 10 grams at each connection pad. However, if one of the connection pads should be 1.3 $\mu$m farther from the plane of the contact bumps than the other connection pads, when the DUT is displaced by 1.3 $\mu$m from first contact, there will be no contact force between this connection pad and its contact bump, and all the contact force that is generated will be consumed by the other contacts. If one assumes that the contact force at a connection pad must be at least 50 percent of the nominal contact force in order for there to be a reliable connection, then the maximum variance from the nominal height that this design will accommodate is ±0.7 $\mu$m. However, the height variations of contact bumps and connection pads produced by the standard processes currently employed in the semiconductor industry exceed 5 $\mu$m. Furthermore, even if the contact bumps are coplanar and the connection pads are coplanar, tolerances in the probing apparatus make it impossible to ensure that the plane of the connection pads is parallel to the plane of the contact bumps, and in order to accommodate these tolerances, it is necessary to displace the DUT by 75 $\mu$m in order to ensure contact at all connection pads. If the dimensions of the finger were changed to accommodate a displacement of 70–80 $\mu$m (75 $\mu$m±5 $\mu$m), the probe would become much less robust. If the probe were supported at a location further back from the root of the fingers, such that most of the deflection would be carried by the substrate rather than the fingers, the ability of the fingers to conform would be limited to 0.13 $\mu$m/gram deflection produced at the fingers themselves.

The connection pads of the DUT are not coplanar, nor are the connection bumps on the probe. Assuming that the nominal plane of the connection pads (the plane for which the sum of the squares of the distances of the pads from the plane is a minimum) is parallel with the nominal plane of the contact bumps, the variation in distance between the connection pad and the corresponding contact bump is up to 5 $\mu$m if both the DUT and the probe are of good quality.

At present, the connection points on an integrated circuit chip are at a pitch of at least 150 $\mu$m, but it is expected that it will be feasible for the pitch to be reduced to about 100 $\mu$m within a few years.

As the need arises to make connection at ever finer pitches, the stress in a probe of the kind shown in U.S. Pat. No. 5,221,895 increases. If the connection pads are at a spacing of 75 $\mu$m, this implies that the width of the fingers must be less than about 50 $\mu$m, and in order to keep the stress below the yield point, the height of the fingers must be at least 400 $\mu$m.

The necessary height of the fingers can be reduced by employing a metal of which the yield point is higher than that of beryllium copper. For example, if the substrate is made of stainless steel, having an elastic modulus of 207× $10^9$ N/m$^2$, the maximum height of the fingers can be reduced to about 350 $\mu$m. However, it follows that the deflection is reduced below that necessary to comply with typical height variations found in the industry. Additionally, the resistivity of stainless steel is substantially higher than that of beryllium copper, and this limits the frequency of the signals that can be propagated by the microstrip transmission lines without unacceptable degradation.

Although the microstrip transmission line has adequate characteristics for signals up to a frequency of 5 GHz, the so-called stripline configuration is desirable for higher frequencies.

SUMMARY OF THE INVENTION

In accordance with a first aspect of the present invention there is provided a method of making a multilayer composite structure for use in manufacture of a contact device for establishing electrical connection to a circuit device, said method comprising providing a substrate of a metal having a resistivity substantially greater than about 10 μohm cm, adhering a first layer of metal having a resistivity less than about 3 μohm cm to a main face of the substrate, the first layer having a main face that is remote from the substrate, adhering a second layer of dielectric material to the main face of the first layer, the second layer having a main face that is remote from the substrate, and adhering a third layer of metal to the main face of the second layer, the metal of the third layer having a resistivity less than about 3 μohm cm.

In accordance with a second aspect of the present invention there is provided a method of making a contact device for use in establishing electrical connection to a circuit device, said method comprising providing a substrate of a metal having a resistivity substantially greater than about 10 μohm cm, the substrate having a major portion and a tip portion projecting therefrom along an axis, adhering a first layer of metal having a resistivity less than about 3 μohm cm to a main face of the substrate, the first layer having a main face that is remote from the substrate, adhering a second layer of dielectric material to the main face of the first layer, the second layer having a main face that is remote from the substrate, adhering a third layer of metal to the main face of the second layer, the metal of the third layer having a resistivity less than about 3 μohm cm, selectively removing metal of the third layer to form discrete conductor runs extending over the tip portion parallel to said axis, while leaving portions of the second layer exposed between the conductor runs, whereby a multi-layer composite structure is formed, and slitting the tip portion of the composite structure parallel to said axis, whereby fingers are formed that project from the major portion of the composite structure in cantilever fashion and each of which supports at least one conductor run.

In accordance with a third aspect of the present invention there is provided a probe apparatus for use in testing an integrated circuit embodied in an integrated circuit chip, said probe apparatus comprising a support member having a generally planar datum surface, a generally planar elastic probe member having a proximal end and a distal end, at least one attachment member attaching the probe member at its proximal end to the support member with the probe member in contact with the datum surface, at least one adjustment member effective between the support member and a location on the probe member that is between the proximal and distal ends thereof for urging the distal end of the probe member away from the support member, whereby the probe member undergoes elastic deflection.

In accordance with a fourth aspect of the present invention there is provided a probe apparatus for use in testing an integrated circuit embodied in an integrated circuit chip, said probe apparatus comprising a support member having a bearing surface, a probe member having a proximal end and a distal end and comprising a stiff substrate having first and second opposite main faces and conductor runs extending over the first main face of the substrate from the distal end of the substrate to the proximal end thereof, the conductor runs of the probe member being distributed over a connection region of the first main face of the substrate in a first predetermined pattern, at least one attachment member attaching the probe member to the support member with the second main face of the probe member confronting the bearing surface of the support member, a circuit board comprising a substrate having a main face and conductor runs distributed over a connection region of said main face of the circuit board in a second predetermined pattern, a flexible circuit comprising a flexible substrate having a main face and first and second connection regions, and conductor runs extending between the first and second connection regions of the flexible substrate and distributed over the first connection region in a pattern corresponding to said first pattern and distributed over the second connection region in a pattern corresponding to said second pattern, a first attachment device attaching the flexible circuit to the support member with the first connection region of the flexible circuit confronting the connection region of the probe member and the conductor runs of the flexible circuit in electrically conductive connection with respective conductor runs of the probe member, and a second attachment device attaching the flexible circuit to the circuit board with the second connection region of the flexible circuit confronting the connection region of the circuit board and the conductor runs of the flexible circuit in electrically conductive connection with respective conductor runs of the circuit board.

In accordance with a fifth aspect of the present invention there is provided a method of making a multilayer composite structure for use in manufacture of a contact device for establishing electrical connection to a circuit device, said method comprising providing a substrate, adhering a first layer of dielectric material to a main face of the substrate, the first layer having a main face that is remote from the substrate, and adhering a second layer of metal to the main face of the first layer, the metal of the second layer having a resistivity less than about 3 μohm cm.

In accordance with a sixth aspect of the present invention there is provided a method of making a contact device for use in establishing electrical connection to a circuit device, said method comprising providing a substrate having a major portion and a tip portion projecting therefrom along an axis, adhering a first layer of dielectric material to the main face of the substrate, the first layer having a main face that is remote from the substrate, adhering a second layer of metal to the main face of the first layer, the metal of the second layer having a resistivity less than about 3 μohm cm, selectively removing metal of the second layer to form discrete conductor runs extending over the tip portion parallel to said axis, while leaving portions of the first layer exposed between the conductor runs, whereby a multi-layer composite structure is formed, and slitting the tip portion of the composite structure parallel to said axis, whereby fingers are formed that project from the major portion of the composite structure in cantilever fashion and each of which supports at least one conductor run.

In accordance with a seventh aspect of the present invention there is provided a contact device having a plurality of nominally coplanar first contact elements for making electrical contact with corresponding nominally coplanar second contact elements of an electronic device by positioning the contact device and the electronic device so that the plane of the first contact elements is substantially parallel to the plane of the second contact elements and effecting relative displacement of the devices in a direction substantially perpendicular to the plane of the first contact elements and the plane of the second contact elements to generate a contact force of at least f at each pair of corresponding first and second contact elements, wherein it is necessary to effect relative displacement of the devices by a distance d in said direction from first touchdown to last touchdown, said contact device comprising a stiff substrate having a major portion with fingers projecting therefrom in cantilever fashion, each finger having a proximal end at which it is connected to the major portion of the substrate and an opposite distal end and there being at least one, and no more than two, contact elements on the distal end of each finger, a support member to which the substrate is attached in a manner such that on applying force in said direction to the distal ends of the fingers, deflection occurs both in the fingers and in the major portion of the substrate, and means for effecting relative movement of the devices in said direction, and wherein the substrate is dimensioned such that relative displacement of the devices in said direction by a distance d from first touchdown generates a reaction force at each contact element of about $0.1*f\pm 0.1*f$, and further relative displacement of the devices in said direction by a distance of about 75 $\mu$m or $5*d$ beyond last touchdown generates a reaction force at each contact element of about $0.9*f\pm 0.1*f$.

BRIEF DESCRIPTION OF THE DRAWINGS

For a better understanding of the invention and to show how the same may be carried into effect, reference will now be made, by way of example, to the accompanying drawings in which:

FIGS. 9A, 9B, and 9C are sectional views illustrating the manner in which the back-up blocks are attached to the mounting plate, FIG. 10 is an enlarged view of a flexible circuit that is used to connect the circuit board to the contact device.

DETAILED DESCRIPTION

Figure 1:
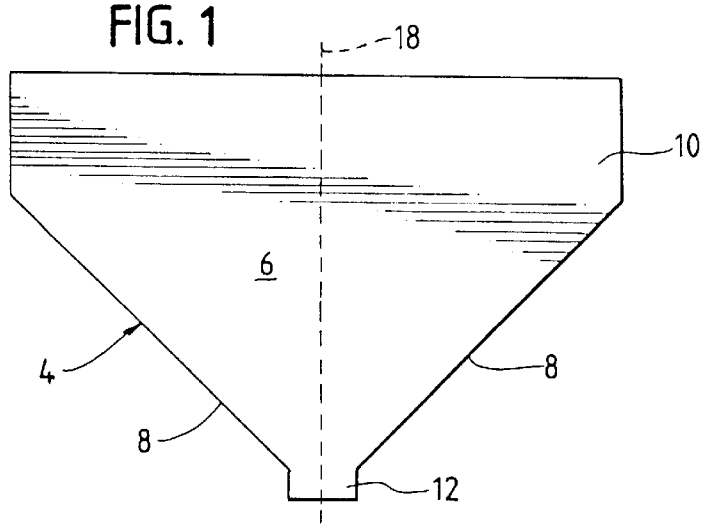
FIGS. 1–5 Illustrate various steps during fabrication of a contact device embodying the present invention, FIGS. 1 and 4 being plan views and FIGS. 2, 3 and 5 being sectional views.

FIG. 1 illustrates a substrate 4 of elastic metal having an upper main face 6 and a lower main face. In a preferred embodiment of the invention, the substrate is stainless steel and is about 125 $\mu$m thick. The substrate is generally triangular in form, having two edges 8 that converge from a support area 10 toward a generally rectangular tip area 12. The substrate is substantially mirror-image symmetrical about a central axis 18.

Figure 2:
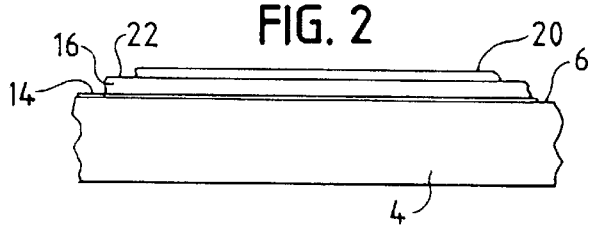

Referring to FIG. 2, a thin film 14 of gold is deposited over the upper main face 6 of the substrate 4 by evaporation or sputtering. The gold film may be augmented by plating if desired. An insulating material such as polyimide is spun or sprayed onto the upper main face of the film 14 in the liquid phase and is then cured to form a layer 16 about 25 $\mu$m thick.

Figure 3:
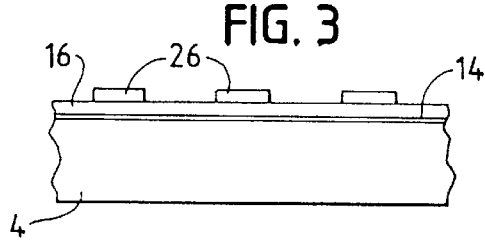
Figure 4:
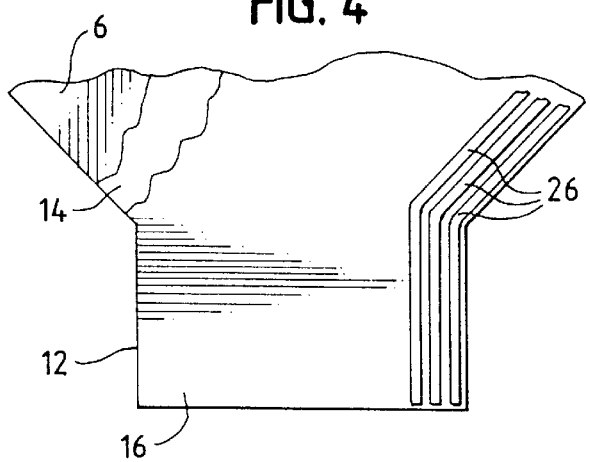
Figure 5:
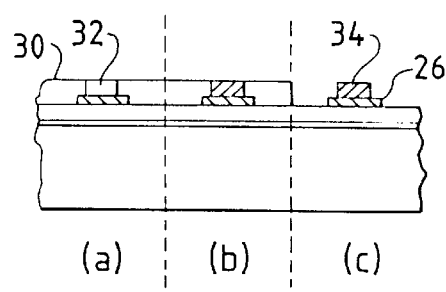

A layer 20 of gold is deposited over the upper main face 22 of the layer 16 by evaporation or sputtering. The layer 20 is patterned using conventional photolithographic techniques to form strips 26 that extend parallel to the central axis 18 over the tip area 12 of the probe and fan out from the tip area over the triangular part of the substrate 4 toward the support area 10 but are connected together at the support area. Each strip has a proximal end and a distal end relative to the support area 10. Additional metal is then deposited over the strips by plating. After the strips have been built up to the desired thickness, which may be about 12 $\mu$m, a layer 30 of photomask material (FIG. 5) is deposited over the upper surface of the structure shown in FIGS. 3 and 4 and holes 32 are formed in that layer over the distal end of each strip 26, as shown in portion (a) of FIG. 5. A hard contact metal, such as nickel, is deposited into these holes (FIG. 5, portion (b)) by plating, and the photomask material is then removed (FIG. 5, portion (c)). The connections between the strips are removed by etching. In this manner, separate conductor runs are formed over the layer 16, and each conductor run has a contact bump 34 over its distal end. The conductor runs are 50 $\mu$m wide and are at a spacing between centers of about 125 $\mu$m over the tip area.

Figure 6:
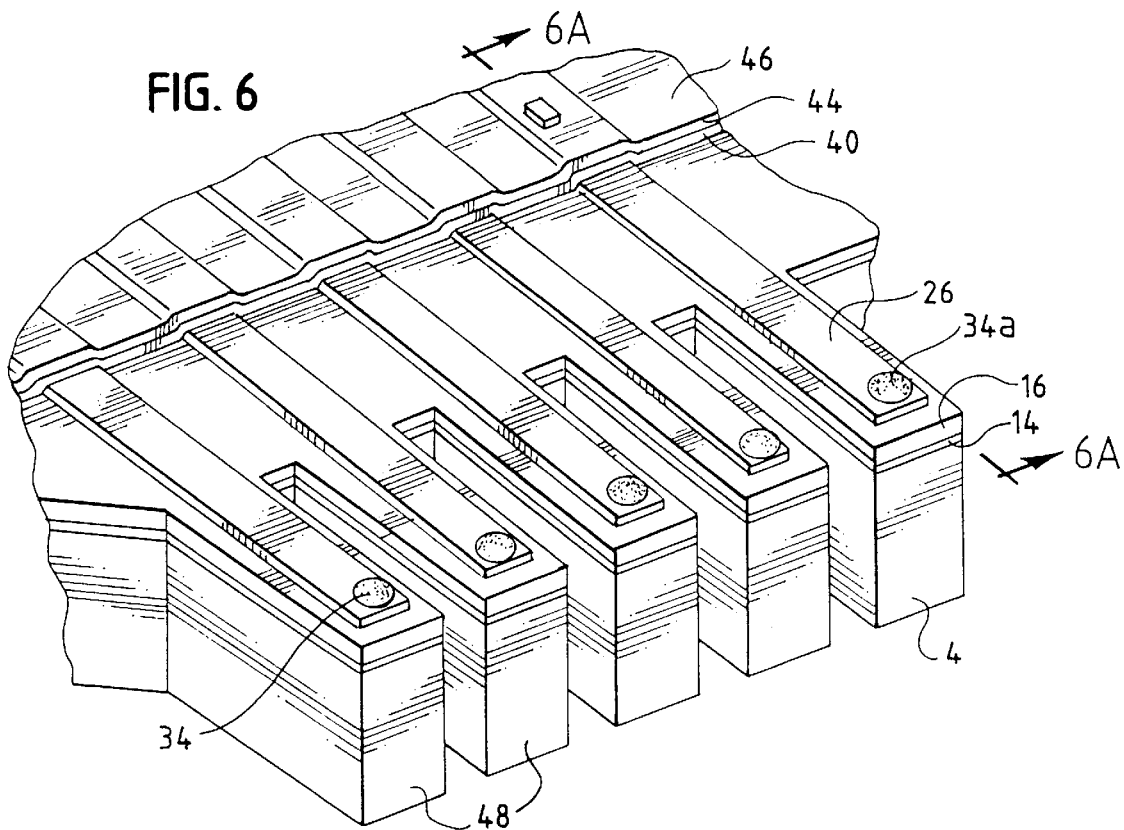
FIG. 6 is a partial perspective view of a contact device embodying the invention.
Figure 6A:
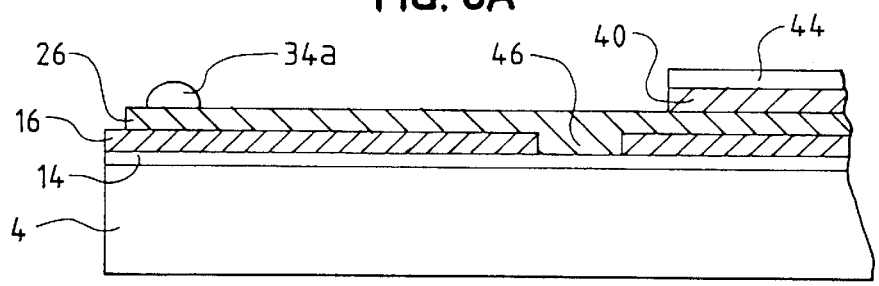
FIG. 6A is a sectional view on the line VIA—VIA of FIG. 6.

Referring to FIG. 6, a cover layer 40 of polyimide is formed over the conductor runs 26, over a region of the substrate that is to the rear, i.e. toward the support area 10, of the rectangular tip area 12 and a layer 44 of gold is deposited over the layer 40 by evaporation or sputtering. The layer 44 may be augmented by plating. The result of the fabrication steps described above is a multilayer structure that comprises the substrate 4, the gold film 14, the polyimide layer 16, the gold conductor runs 26, the polyimide layer 40, and the gold layer 44.

The tip area of the multilayer structure is then slit, whereby the tip area is divided into multiple separately flexible fingers 48 that project in cantilever fashion from the major portion of the structure. A given finger of the substrate may carry the distal end portion of a single conductor run, or it may carry the distal end portions of two adjacent conductor runs. The slitting of the tip area may be performed by ablation using a ultraviolet laser. The poor thermal conductivity of stainless steel is a favorable factor with regard to the laser ablation process. The width of the kerf that is removed is about 17 $\mu$m, so that the width of a finger is either about 108 $\mu$m or about 233 $\mu$m. The length of each finger is about 1 mm.

The structure shown in FIG. 6 may be used as a contact device for making electrical connection to contact pads of an electrical circuit device, such as an integrated circuit chip or a flat panel display device. The nickel bumps 34 serve as probe elements for contacting the connection pads of the circuit device. When the contact device is in use, each nickel bump contacts a single connection pad of the circuit device. A bump 34a that is to contact a ground pad of the circuit device is connected to the substrate by means of vias 46 formed in holes in the layer 16 before depositing the layer 20. Multiple vias 46 are provided along the length of the conductor run 26 that ends at the bump 34a in order to ensure that the contact bump 34a is firmly grounded.

The configuration of the conductor runs and their spacing results in there being a stripline transmission line environment to the rear of the forward boundary of the layer 44;

whereas there is a microstrip transmission line environment forward of the layer 44. Naturally, the slitting of the tip area results in degradation of the microstrip transmission line environment. In the case of the fingers being about 1 mm long, the microstrip transmission line environment extends to a point that is about 2 mm from the contact bumps. However the degradation is not so severe as to distort signals at frequencies below about 10 GHz to an unacceptable degree.

The structure shown in FIG. 6 may be used for probing a circuit device in a semiconductor tester, as will be described with reference to FIGS. 7–11.

Figure 7:
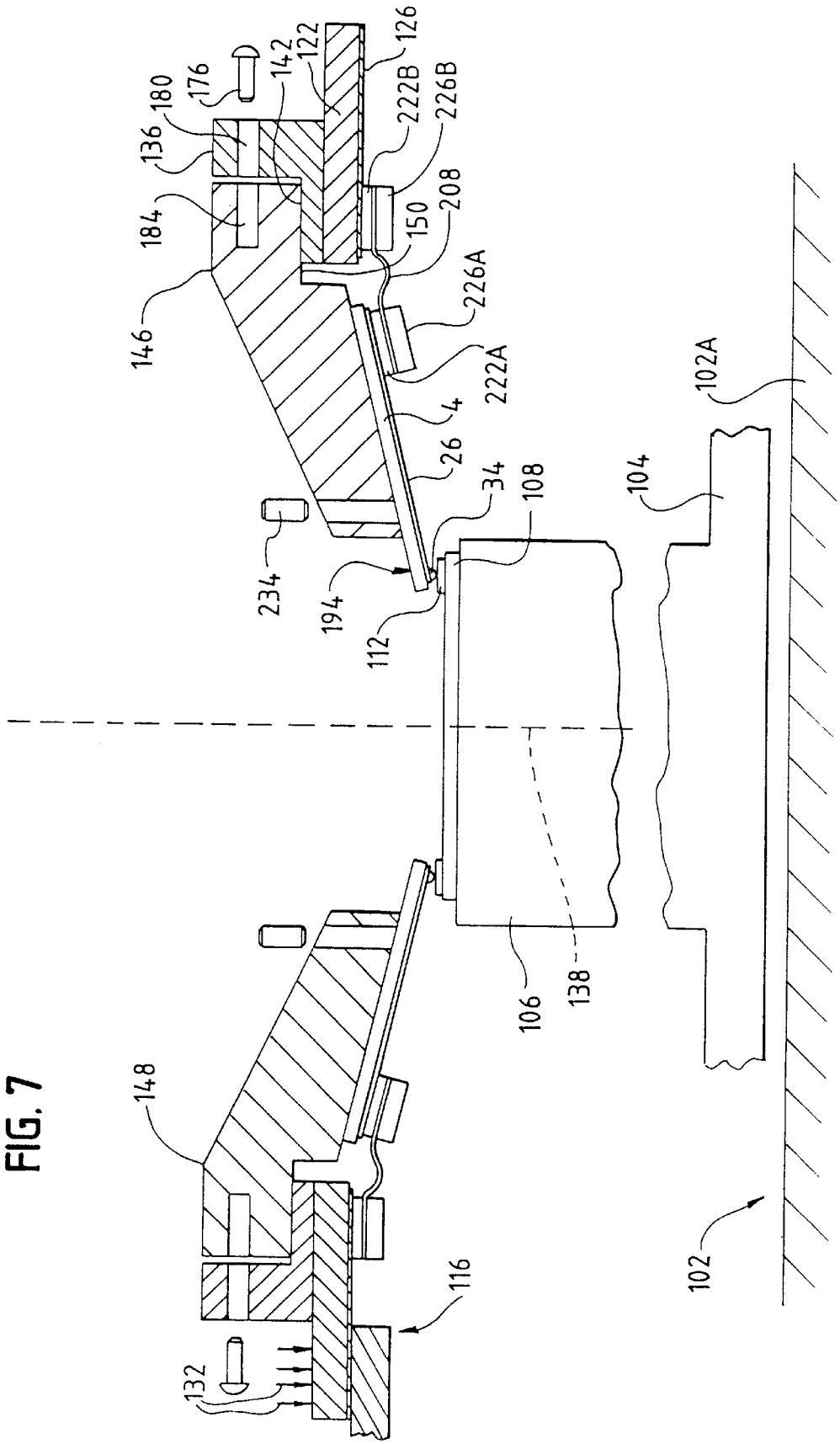
FIG. 7 is a general view, partly in section, of a semiconductor tester.
Figure 8:
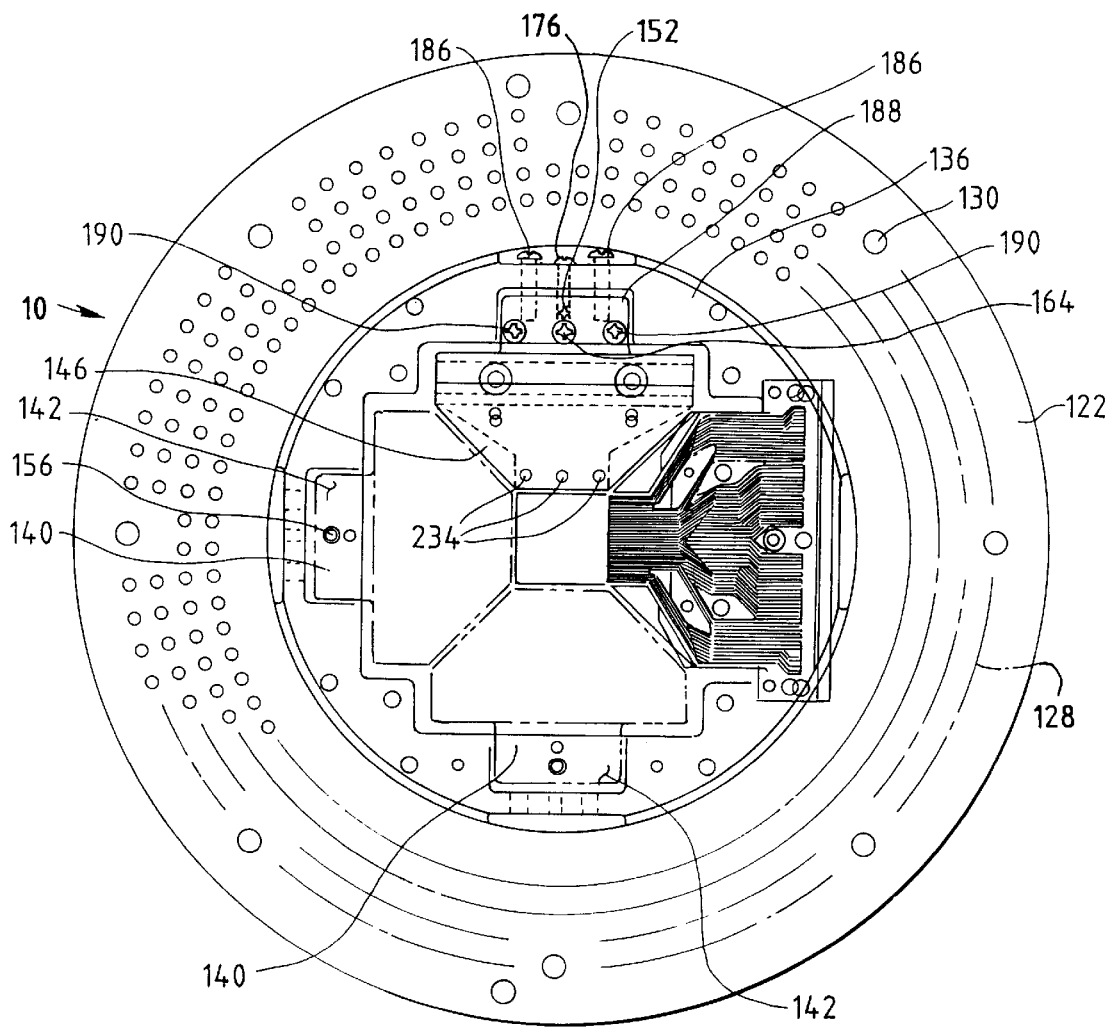
FIG. 8 is a plan view of a circuit board and mounting plate that form part of the test head of the tester shown in FIG. 7.
Figure 9:
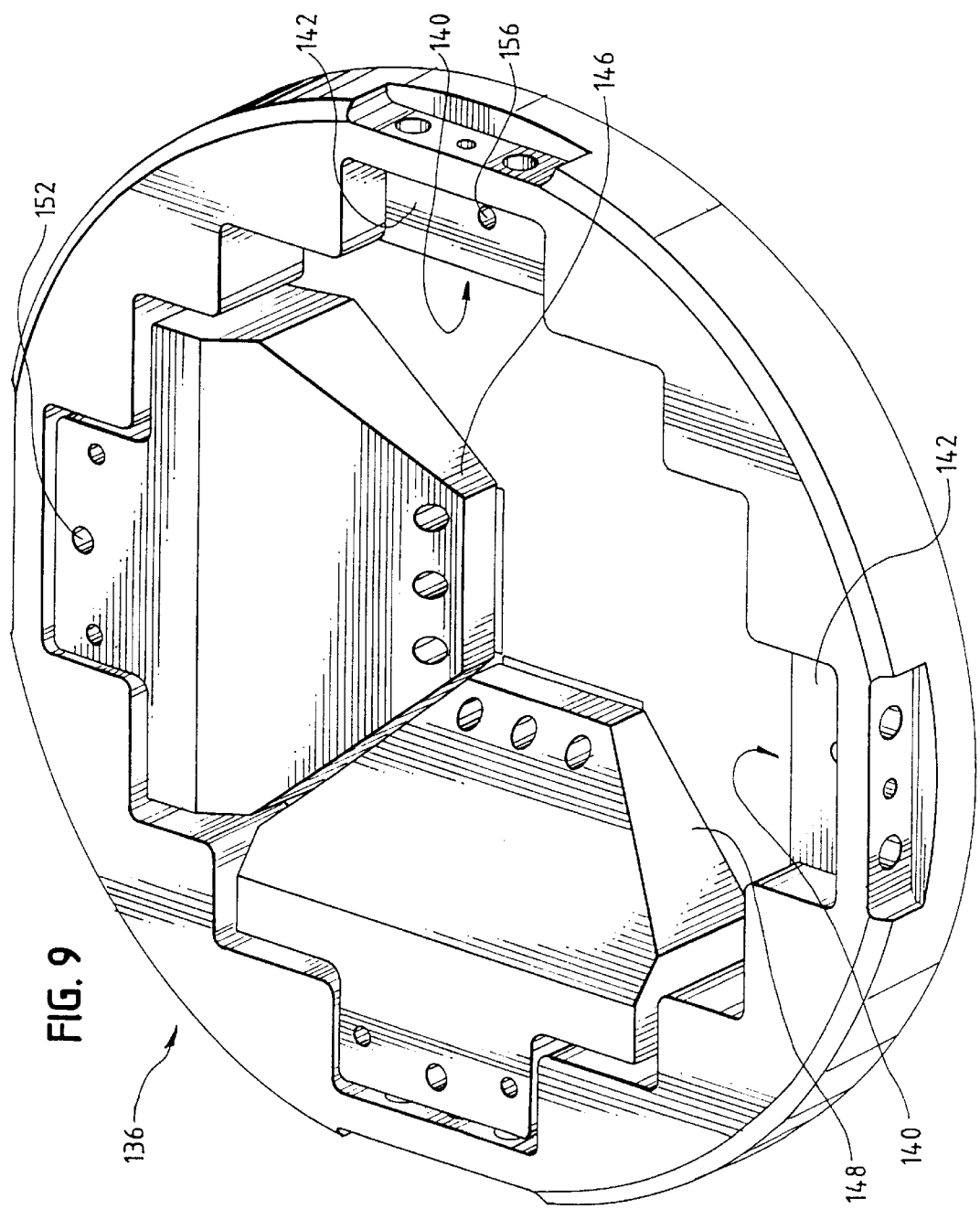
FIG. 9 is an enlarged perspective view of the mounting plate and also illustrates back-up blocks that are attached to the mounting plate.
Figure 11A:
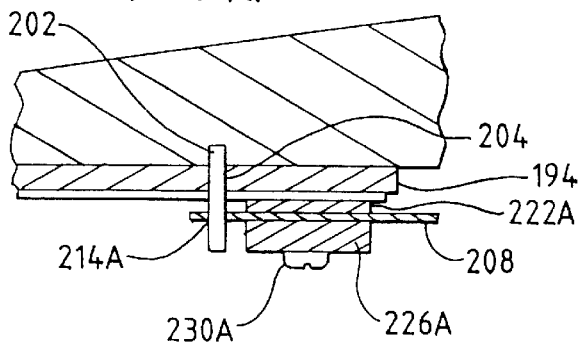
FIGS. 11A and 11B are sectional views illustrating the manner in which the contact device and the flexible circuit are positioned relative to the mounting block.
Figure 11B:
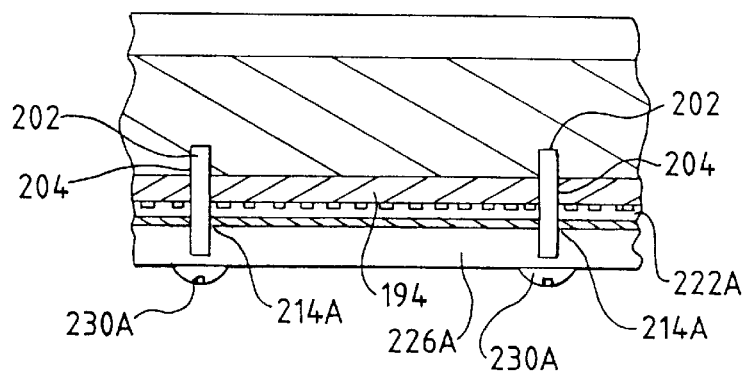
Figure 12A:
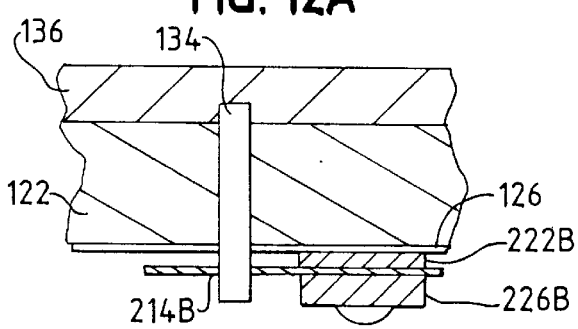
FIGS. 12A and 12B are sectional views illustrating the manner in which the mounting plate and the flexible circuit are positioned relative to the circuit board.
Figure 12B:
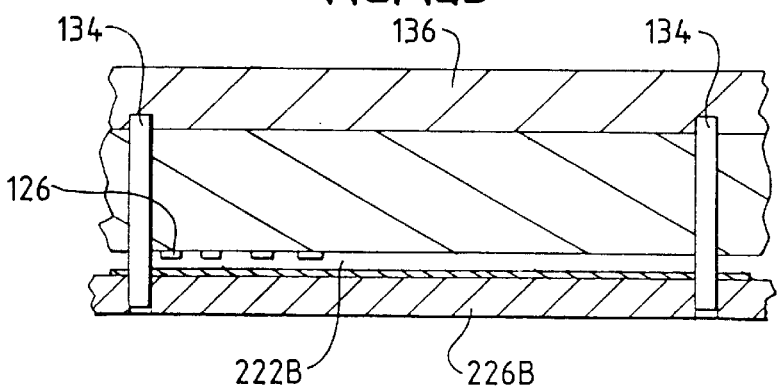

Referring to FIG. 7, the tester comprises a prober 102 having a frame 102a that serves as a mechanical ground. A device positioner 104 having a vacuum chuck 106 is mounted within the prober 102. The prober includes stepping motors (not shown) that act on the device positioner for translating the vacuum chuck relative to the frame 102a in two perpendicular horizontal directions (X and Y) and vertically (Z), and for rotating the vacuum chuck about a vertical axis. The vacuum chuck holds a device under test, or DUT, 108. FIG. 7 illustrates the DUT 108 as a die that has previously been separated from other dice of the wafer in which it was fabricated, but it will be appreciated that, with appropriate modifications, the apparatus could be used for testing a semiconductor device at the wafer stage. As shown in FIG. 7, the DUT 108 has contact pads 112.

The tester also comprises a test head 116 that can be docked to the prober so that it is in a reliably reproducible position relative to the prober frame 102a. The test head 116 includes an essentially rigid circuit board 122 (FIG. 8) that comprises an insulating substrate and conductor runs 126 exposed at the lower main face of the substrate. Vias (not shown) extend through the substrate and terminate at contact pads 128 that are exposed at the upper main face of the substrate. The circuit board 122 is removably held in the test head by screws that pass through holes 130 in the circuit board. When the test head 116 is docked in the prober 102 and the circuit board 122 is installed in the test head, the circuit board 122 is disposed horizontally and the contact pads 128 engage pogo pins 132, shown schematically in FIG. 7, by which the contact pads of the circuit board are connected to stimulus and response instruments (not shown).

A mounting plate 136 is secured to the circuit board 122. The mounting plate is positioned relative to the circuit board by guide pins 134 that project downward from the mounting plate and enter corresponding holes in the circuit board. The manner in which the mounting plate is attached to the circuit board will be described below.

The mounting plate has a generally cylindrical exterior surface of which the central axis 138 is considered to be the axis of the plate. The plate 136 is disposed with its axis 138 vertical and defines a cross-shaped through opening (FIG. 9) that is mirror image symmetrical about X-Z and Y-Z planes that intersect at the axis 138. At the outer end of each limb of the cross, the plate 136 is formed with a notch 140 that extends only part way through the plate and is bounded in the vertically downward direction by a horizontal surface 142.

A backup block 146 having the general shape, when viewed in plan, of a trapezoid seated on a rectangular base is positioned with its rectangular base in one of the notches 140. Similar backup blocks 148 are mounted in the other notches. The following description of the backup block 146 and associated components applies equally to the backup blocks 148.

The rectangular base of the backup block 146 has a planar mounting surface 150 (FIG. 7) that can be seated against the horizontal surface 142 at the bottom of the notch 140. For assembling the backup block 146 to the mounting plate 136, the backup block is formed with a hole 152 extending through its rectangular base, and the mounting plate is formed with a blind hole 156 that is parallel to the axis of the mounting plate and enters the plate 136 at the horizontal surface 142. A guide pin 160 is inserted through the hole 152 in the backup block and into the blind hole 156 in the mounting plate, and in this manner the backup block is positioned with a moderate degree of precision relative to the mounting plate.

The backup block 146 is then attached to the mounting plate 136 by a vertical locking screw 164 (FIG. 8) that passes through a clearance hole 168 in the backup block 146 and enters a threaded bore 172 in the mounting plate 136 and a horizontal locking screw 176 (FIG. 7) that passes through a clearance hole 180 in the mounting plate and enters a threaded bore 184 in the backup block. The backup block 146 is thereby attached to the mounting plate, and the guide pin 160 is then removed. The clearance holes 168 and 180 allow a small degree of horizontal and vertical movement of the backup block relative to the mounting plate.

Two horizontal screws 186, which are horizontally spaced and disposed one on each side of the screw 176, are inserted through threaded holes in the peripheral wall of the plate 136 and enter blind clearance holes in the backup block. Similarly, two vertical screws 190, which are horizontally spaced and disposed one on each side of the screw 164, are inserted through threaded holes in the backup block 146 and engage the surface 142 of the mounting plate 136. The screws 176 and 186 can be used to adjust the horizontal position of the backup block relative to the mounting plate 136. By selectively turning the screws 176 and 186, the backup block can be advanced or retracted linearly and/or rotated about a vertical axis. In similar fashion, using screws 164 and 190, the backup block can be raised or lowered relative to the mounting plate and/or tilted about a horizontal axis. When the backup block is in the desired position and orientation, the locking screws are tightened.

The apparatus shown in FIGS. 7–10 also comprises a contact device 194 associated with the backup block 146. The contact device 194 is generally triangular and has two edges that converge from a support area toward a generally rectangular tip area. The tip area of the contact device is divided into multiple fingers that extend parallel to an axis of symmetry of the contact device. The contact device includes conductor runs that extend from the support area to the tip area, and one run extends along each finger in the tip area. At its support area, the conductor runs of the contact device are exposed on the underside of the contact device. The contact device may be fabricated by the method that is described above with reference to FIGS. 1–6.

Inboard of the rectangular base, the trapezoidal portion of the backup block 146 extends downward toward the central axis 138. The contact device 194 is disposed below the inclined lower surface of the backup block 146 and is positioned relative to the backup block by guide pins 202 that project from the backup block and pass through alignment holes 204 in the contact device. The manner in which the contact device is attached to the backup block will be described below.

The apparatus also comprises a flexible circuit 208 having an inner edge region 208A and an outer edge region 208B. The flexible circuit comprises a substrate of polyimide or similar insulating material, a ground plane (not shown) on the lower side of the substrate, and multiple discrete conductor runs 210 on the upper side of the substrate. Over the inner edge region 208A, the spacing of the conductor runs 210 corresponds to the spacing of the conductor runs across the support area of the contact device 194, and over the outer edge region 208B, the spacing of the conductor runs 210 corresponds to the spacing of the conductor runs 126 along the inner edge of the printed circuit board 122.

The flexible circuit is formed with inner and outer pairs of alignment holes 214A and 214B. The inner pair of alignment holes 214A are threaded by the guide pins 202, whereby the inner edge region 208A is positioned relative to the contact device 194. Similarly, the outer pair of alignment holes 214B are threaded by the guide pins 134, whereby the outer edge region 208B of the flexible circuit is positioned relative to the printed circuit board. The flexible circuit is also formed with two sets of mounting holes 218A and 218B.

The support area of the contact device 194, the inner edge region 208A of the flexible circuit, and a first length 222A of Shinetsu strip are clamped between the backup block and a clamping plate 226A by means of screws 230A. The outer edge region 208B of the flexible circuit 208, the inner region of the printed circuit board 122, and a second length 222B of Shinetsu strip are clamped between the mounting plate 136 and a second clamping plate 226B by means of screws 230B. The positions of the alignment holes 214A and 214B relative to the conductor runs of the flexible circuit are such that the conductor runs 210 at the inner edge region 208A of the flexible circuit are in registration with the conductor runs 26 in the support area of the contact device, and the conductor runs 210 in the outer edge region 208B of the flexible circuit are in registration with the conductor runs 126 along the inner edge of the printed circuit board. The Shinetsu strip, the thickness of which is exaggerated in FIG. 7, is characterized by anisotropic electrical conductivity when compressed perpendicular to its length: its conductivity is very good in directions perpendicular to its own plane and is very bad in directions parallel to its own plane and to its length. Thus, the Shinetsu strip 222A connects the conductor runs 26 of the probe member 194 to respective conductor runs 210 of the flexible circuit 208, and the Shinetsu strip 222B connects the conductor runs 210 of the flexible circuit 208 to respective conductor runs 126 of the printed circuit board 122.

Tightening of the clamping screws compresses the Shinetsu strips, which then establish a good electrically conductive connection between the conductor runs of the contact device and the conductor runs 126 of the printed circuit board 122, through the Shinetsu strips and respective conductor runs of the flexible circuit 208.

As described with reference to FIGS. 1–6, the tip area of the contact device 194 is divided into fingers, each of which has a contact run that terminates in a contact bump. Since the tip area is spaced from the support area, at which the contact device is clamped to the backup block, the tip area can be deflected away from the plane of the underside of the backup block. Vertical adjustment screws 234 are fitted in respective threaded holes in the backup block 146. By appropriate adjustment of the screws 234, the contact device can be preloaded to a condition in which the contact device 194 is deflected downwards relative to the backup block 146, and by further adjustment of the screws 234 the tip area can be forced downward, or permitted to rise, or tilted about the axis 18. Mechanical ground therefore extends to a location of the contact device that is beyond the support area but does not extend as far as the tip area.

When all four backup blocks are properly installed in the mounting plate 136, the tip portions of the four contact devices extend along four edges of a square and are positioned for making electrically conductive contact to the contact pads of the device under test. By observing the DUT through the opening defined between the inner ends of the four backup blocks, the DUT can be positioned for contacting the contact bumps when the DUT is raised by the positioning device.

When the DUT is raised relative to the test head, the contact pads of the DUT engage the contact bumps of the contact device. After initial contact has been established (first touchdown), the DUT is raised an initial 10–15 $\mu$m, which is sufficient to absorb any expected error in coplanarity of the contact bumps and contact pads and achieve last touchdown (each contact bump is in contact with its respective contact pad). The DUT is then raised by a further 75 $\mu$m. The spring rate of the fingers and the spring rate of the base region of the substrate, betweeen the fingers and the support area, are such that the contact force exerted at each contact pad is at least 10 grams. The initial deflection of 10–15 $\mu$m is sufficient to provide a contact force of 2 grams at a single finger, whereas the further deflection of 75 $\mu$m provides a contact force of N*10 grams, where N is the number of fingers, or 10 grams per finger. By sharing the deflection between the fingers and the base region of the substrate, a high degree of compliance is achieved, allowing contact with all the contact bumps, without sacrificing the contact force that is needed to achieve a reliable electrical contact between the contact bumps and the fingers.

The elastic nature of the metal of the substrate ensures that when the DUT is brought into contact with the contact bumps, and is slightly over driven, deflection of the fingers provides a desirable scrubbing action and also supplies sufficient contact force for providing a reliable pressure contact between the contact bump and the connection pad of the DUT.

The film 14 of gold serves as the ground plane, and the substrate 4, although conductive, does not contribute to the electrical performance of the device.

It will be appreciated that the invention is not restricted to the particular embodiment that has been described, and that variations may be made therein without departing from the scope of the invention as defined in the appended claims and equivalents thereof. For example, although the invention has been described with reference to the drawings in terms of strip line and microstrip transmission line environments, if the film 14 were omitted and every other conductor run 26 across the contact device were a ground conductor run, a combination of a microstrip and coplanar transmission line environment would be provided. If every other conductor run were not a ground run, a microstrip transmission line environment would be provided as far as the forward edge of the layer 44, and for some applications, it might be acceptable for the transmission line environment to terminate at this point, provided that it is quite close to the contact bumps. Application of the invention to a semiconductor tester has been described with reference to an implementation in which there is one contact bump on each finger of the contact device, and the use of individual fingers for each contact bump ensures maximum accommodation of non-coplanarity of the contact pads of the DUT. However, it might be advantageous to provide two contact bumps, each connected to its own conductor run, since torsion of the finger accommodates a difference in height of the respective contact pads, and the greater width of the finger provides substantially greater stiffness with respect to deflection. The invention is not limited to testing of devices prior to packaging and may be used for final testing of packaged devices, particularly a device that is packaged for surface mounting, since the terminals are then suitably positioned for engagement by the contact bumps.

What is claimed is:

1. A probe apparatus for use in testing an electronic device having connection points formed thereon, said probe apparatus comprising:

a support member having a generally planar support surface;

a generally planar elastic probe member having a proximal end and a distal end, wherein the probe member comprises a substrate having fingers projecting from the distal end of the probe member, wherein the fingers have conductors with contacts formed thereon for connection with the connection points of the electronic device, wherein each of the fingers has one or two conductors each having a contact formed thereon; and at least one attachment member attaching the probe member at its proximal end to the support member with the probe member in contact with the support surface, wherein the probe member has a mechanical ground positioned away from the fingers towards the proximal end, wherein deflection resulting from contact between the probe member and the electronic device is shared between the fingers and a portion of the substrate not including the fingers.

2. The probe apparatus of claim 1, further comprising at least one adjustment member effective between the support member and a location on the probe member that is between the proximal and distal ends thereof for urging the distal end of the probe member away from the support member, whereby the probe member undergoes elastic deflection.

3. The probe apparatus of claim 1, wherein the fingers are about 125 µm in thickness.

4. The probe apparatus of claim 1, wherein the connection points of the electronic devices are spaced to have a pitch of about 100 µm.

5. The probe apparatus of claim 1, wherein the conductors are about 50 µm wide and the fingers are about 1 mm in length.

6. The probe apparatus of claim 1, wherein the electronic device comprises an integrated circuit.

7. The probe apparatus of claim 1, wherein the fingers and the substrate each have a spring rate determined so that a predetermined minimum contact force is exerted on each of the connection points.

8. The probe apparatus of claim 7, wherein the predetermined minimum contact force is about 10 grams.

9. The probe apparatus of claim 1, wherein at least a portion of the conductors comprise striplines.

10. The probe apparatus of claim 1, further comprising stimulus and response instruments for applying and receiving signals to and from the electronic device.

11. The probe apparatus of claim 1, wherein one or more fingers having two conductors formed thereon undergo torsion to accommodate height differences between connection points of the electronic device.

12. A probe apparatus for use in testing an electronic device having connection points formed thereon, said probe apparatus comprising:

a support member having a bearing surface;

a probe member having a proximal end and a distal end and comprising a substrate having first and second opposite main faces and conductor runs extending over the first main face of the substrate from the distal end of the substrate to the proximal end thereof, the conductor runs of the probe member being distributed over a connection region of the first main face of the substrate in a first predetermined pattern, wherein the probe member includes fingers at the distal end, wherein the fingers include conductor runs for connection with the connection points of the electronic device, wherein each of the fingers has one or two conductor runs formed thereon;

at least one attachment member attaching the probe member to the support member with the second main face of the probe member confronting the bearing surface of the support member, wherein the probe member has a mechanical ground positioned away from the fingers toward the proximal end, wherein deflection resulting from contact between the probe member and the electronic device is shared between the fingers and a portion of the substrate not including the fingers;

a circuit board comprising a substrate having a main face and conductor runs distributed over a connection region of said main face of the circuit board in a second predetermined pattern;

a flexible circuit comprising a flexible substrate having a main face and first and second connection regions, and conductor runs extending between the first and second connection regions of the flexible substrate and distributed over the first connection region in a pattern corresponding to said first pattern and distributed over the second connection region in a pattern corresponding to said second pattern;

a first attachment device attaching the flexible circuit to the support member with the first connection region of the flexible circuit confronting the connection region of the probe member and the conductor runs of the flexible circuit in electrically conductive connection with respective conductor runs of the probe member; and a second attachment device attaching the flexible circuit to the circuit board with the second connection region of the flexible circuit confronting the connection region of the circuit board and the conductor runs of the flexible circuit in electrically conductive connection with respective conductor runs of the circuit board.

13. The probe apparatus of claim 12, wherein the fingers are about 125 µm in thickness.

14. The probe apparatus of claim 12, wherein the connection points of the electronic devices are spaced to have a pitch of about 100 µm.

15. The probe apparatus of claim 12, wherein the conductors are about 50 µm wide and the fingers are about 1 mm in length.

16. The probe apparatus of claim 12, wherein the electronic device comprises an integrated circuit.

17. The probe apparatus of claim 12, wherein the fingers and the substrate each have a spring rate determined so that a predetermined minimum contact force is exerted on each of the connection points.

18. The probe apparatus of claim 17, wherein the predetermined minimum contact force is about 10 grams.

19. The probe apparatus of claim 12, wherein at least a portion of the conductors comprise striplines.

20. The probe apparatus of claim 12, further comprising stimulus and response instruments for applying and receiving signals to and from the electronic device.

21. The probe apparatus of claim 12, wherein one or more fingers having two conductor runs formed thereon undergo torsion to accommodate height differences between connection points of the electronic device.

22. A probe apparatus for testing an electronic device having connection points thereon, comprising:

a probe member having a proximal end and a distal end, wherein the probe member comprises a substrate having fingers projecting from the distal end of the probe member, wherein the fingers have conductors formed thereon for connection with the connection points of the electronic device, wherein each of the fingers has one or two conductors formed thereon; and a support member mechanically coupled to the probe member;

wherein the support member is coupled to the probe member so that the probe member has a mechanical ground positioned away from the fingers towards the proximal end, wherein deflection resulting from contact between the probe member and the electronic device is shared between the fingers and a portion of the substrate not including the fingers.

23. The probe apparatus of claim 22, further comprising an attachment member mechanically coupling the probe member to the support member, wherein the attachment member includes electrical connectors for connecting the conductors of the probe member to stimulus and response instruments.

24. The probe apparatus of claim 22, wherein the fingers are about 125 $\mu$m in thickness.

25. The probe apparatus of claim 22, wherein the connection points of the electronic devices are spaced to have a pitch of about 100 $\mu$m.

26. The probe apparatus of claim 22, wherein the conductors are about 50 $\mu$m wide and the fingers are about 1 mm in length.

27. The probe apparatus of claim 22, wherein the electronic device comprises an integrated circuit.

28. The probe apparatus of claim 22, wherein the fingers and the substrate each have a spring rate determined so that a predetermined minimum contact force is exerted on each of the connection points.

29. The probe apparatus of claim 28, wherein the predetermined minimum contact force is about 10 grams.

30. The probe apparatus of claim 22, wherein at least a portion of the conductors comprise striplines.

31. The probe apparatus of claim 22, further comprising stimulus and response instruments for applying and receiving signals to and from the electronic device.

32. The probe apparatus of claim 22, wherein one or more fingers having two conductors formed thereon undergo torsion to accommodate height differences between connection points of the electronic device.

\* \* \* \* \*